United States Patent
Horie et al.

(10) Patent No.: US 6,617,663 B2
(45) Date of Patent: Sep. 9, 2003

(54) METHODS OF MANUFACTURING SEMICONDUCTOR DEVICES

(75) Inventors: Tomokazu Horie, Sakata (JP); Shinichi Sugiyama, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/090,484

(22) Filed: Mar. 1, 2002

(65) Prior Publication Data

US 2002/0123207 A1 Sep. 5, 2002

(30) Foreign Application Priority Data

Mar. 5, 2001 (JP) ........................................ 2001-060623

(51) Int. Cl.$^7$ .............................................. H01L 29/00
(52) U.S. Cl. ........................ 257/510; 257/506; 257/288; 257/365; 438/221; 438/353
(58) Field of Search ................................. 257/510, 327, 257/288, 365, 503, 506, 528, 919; 438/221, 296, 353

(56) References Cited

U.S. PATENT DOCUMENTS 5,976,949 A * 11/1999 Chen ........................... 438/427
6,495,855 B1 * 12/2002 Sawamura ................... 257/48

* cited by examiner

*Primary Examiner*—Nathan J. Flynn
*Assistant Examiner*—Scott Wilson
(74) *Attorney, Agent, or Firm*—Hogan & Hartson, LLP

(57) ABSTRACT

A planarization method includes forming a dummy pattern in a film over a substrate. The dummy pattern includes a plurality of concave and convex portions. A chemical-mechanical polishing process is applied to the film, with the dummy pattern providing planarization of enhanced uniformity in comparison with known techniques.

29 Claims, 5 Drawing Sheets

FIG. (9b)
PRIOR ART

METHODS OF MANUFACTURING SEMICONDUCTOR DEVICES

BACKGROUND OF THE INVENTION

The invention relates to semiconductor devices and methods for manufacturing the same. More particularly, the invention provides an improved pre-planarization processing method performed on a layer of a semiconductor device that has a large area of element forming regions which is subjected to a chemical-mechanical polishing (CMP) process.

With increased miniaturization and higher integration of semiconductor elements, there has been a reduction in the line-width of gate electrodes and wirings as well as a reduction in pitches. Accordingly, it is important to evaluate the lithography techniques used to form gate electrodes and wirings, and the film quality used to manufacture elements. These conditions are evaluated in advance using an evaluation wafer. A variety of patterns are formed in the evaluation wafer in order to evaluate various manufacturing steps. These patterns correspond to elements in an actual design, and include various conditions with measurements and pitches that correspond to those of the actual design. Evaluation wafers of this type are sometimes referred to as TEG (Test Element Group) wafers.

In recent years, the number of wiring layers has increased along with further device miniaturization and higher integration of semiconductor elements. Chemical-mechanical polishing (CMP) has become indispensable for planarizing formed layers. In the CMP process, concave and convex portions in a layer to be planarized are smoothed out after a predetermined time by selectively creating different polishing rates by applying different pressures to the concave and convex portions and selectivity for polishing surface by using slurry.

With the evaluation wafer technique described above, the CMP process is also used for planarizing layers of the semiconductor device. FIGS. 9(a) and 9(b) illustrate a case in which trench element isolating insulation films are formed as element isolation regions.

FIGS. 9 (a) and 9 (b) provide cross-sectional views of intermediate steps for forming trench element isolation regions according to a conventional technique. As shown in FIG. 9 (a), a mask pattern of a nitride film (silicon nitride film or the like) 92 is formed on a silicon semiconductor substrate 91, and element isolation trenches 93 are formed by etching. After the trenches 93 are oxidized (not shown), an oxide film 94 is formed by a chemical vapor deposition (CVD) method. The oxide film 94 is formed in different deposit levels according to the concave and convex portions of the trenches 93.

An evaluation wafer 91 is provided with an element region 95 having a large area where gate wirings are laid at predetermined pitches. As a result, the oxide film 94 on the element region 95 having a large area is deposited higher than other regions, and forms a large platform area (convex section) 941.

A polishing pad used in the CMP process applies pressure to the convex sections of the layer to be planarized (the oxide film 94) that is greater than that applied to the concave sections. This creates greater polishing rates at the convex sections than in the concave sections. The pressure of the polishing pad at a large area convex portion having is widely dispersed, however, and the polishing rate at the convex region is thereby reduced. In other words, the platform region 941 on the element region 95 cannot be planarized in the same manner as the other fine concave and convex regions where the deposit level is lower, and errors in the planarization increase.

Accordingly, as shown in FIG. 9 (b), the platform region 941 of the oxide film 94 on the element region 95 with an area larger than other regions is entirely etched to a certain level using a lithography technique to approximate its level to the deposit level in the other regions. A protruded section 942 is formed due to a forming margin provided in a resist mask pattern. When the CMP process is then performed after this structure has been formed, planarized levels with small errors are created. Although not shown, the nitride film 92 is detected as a stopper film for the CMP process, and then the nitride film is removed. As a result, a trench element isolating insulation film in which the oxide film 94 is embedded in the trenches 93 is formed.

However, problems of dishing characteristic to the CMP process may not be avoided in the countermeasure provided for the platform region 941 of the oxide film 94 with a large area, such as the one shown in FIG. 9(b). Since the platform region 941 with a large area has no trench, and therefore almost no concave and convex portions, dishing is likely to occur.

FIG. 10 shows a cross-section obtained at the time of detection of the nitride film 92 as a stopper film for the CMP process after planarization is conducted on the structure shown in FIG. 9(b). Dishing occurs over the large area element region 95, such that the nitride film 92 is exposed earlier than other regions, and the CMP process is completed. If the process proceeds to the step of removing the nitride film 92, the nitride film 92 cannot be completely removed because the oxide film 94 remains on the nitride film 92.

In order to avoid the problem described above, the CMP process is unavoidably and excessively performed, even after the nitride film 92 has been detected, for a period of time expected to remove the oxide film 94 that remains on the nitride film 92. As a consequence, problems occur in that the CMP process efficiency is decreased, deterioration of the polishing pad progresses, and the film thickness of the oxide film (94) as a trench element isolation film varies.

The present invention has been made in view of the circumstances described above. The invention provides a pre-planarization processing method that can readily reduce dishing even in a large area region with few concave and convex portions. By using the invention, a planarized level can be created with few variations in the film thickness and with a minimal amount of polishing.

SUMMARY OF THE INVENTION

The invention provides a method for semiconductor device manufacturing in which a platform region is formed, typically on a semiconductor substrate. A dummy pattern is then formed in the platform region. The dummy pattern includes a plurality of regions of differing heights. The dummy pattern is then subjected to chemical-mechanical polishing to remove at least a portion of the platform region. Provision of the dummy pattern provides polishing of enhanced uniformity in comparison with previously known methods.

In accordance with one embodiment of the present invention, a dummy pattern having a plurality of concave and convex portions with a specified depth is formed entirely in a platform region. As a result, the selectivity of polishing rates created by the chemical-mechanical polishing pad can be effectively used, and slurry uniformly spread throughout the concave portions so that uniform CMP processing is accomplished.

The dummy pattern may preferably be provided by forming a lattice pattern of grooves by a photolithography technique. Alternatively, the dummy pattern may be provided by forming a plurality of openings by a photolithography technique. Other features and advantages of the invention will be apparent from the following detailed description, taken in conjunction will the accompanying drawings which illustrate, by way of example, various features of embodiments of the invention.

BRIEF DESCRIPTION OF THE DRAWINGS

FIGS. 9(a) and 9(b) are cross-sections that illustrate intermediate steps of a conventional process forming a trench element isolation region according to a conventional technique.

DETAILED DESCRIPTION OF PREFERRED EMBODIMENTS

Figure 1A:
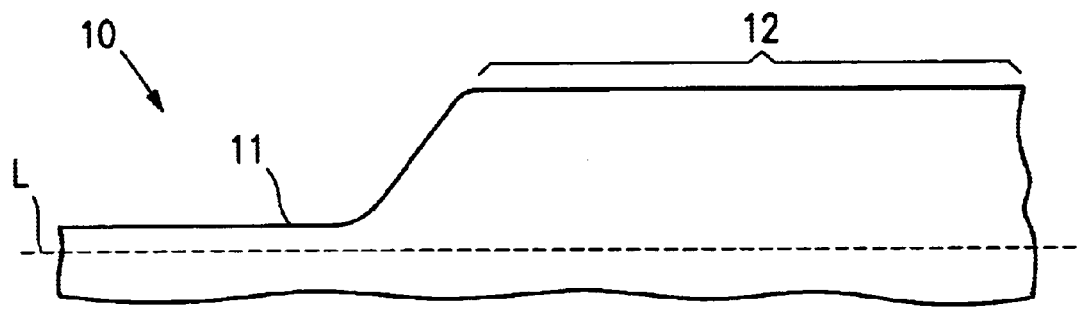
FIGS. 1(a) and 1(b) show cross-sections illustrating the process order of a method of manufacturing a semiconductor device according to one embodiment of the invention.
Figure 1B:
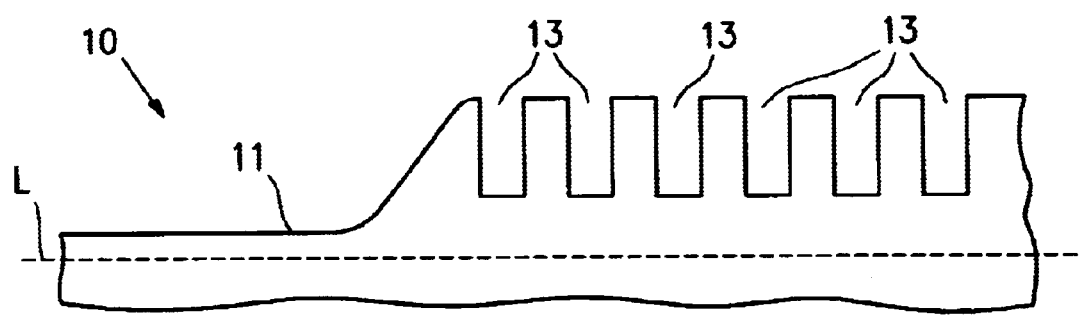

FIGS. 1(a) and 1(b) are cross-sectional views illustrating process steps in a pre-planarization processing step of a method of manufacturing a semiconductor device in accordance with one embodiment of the present invention. As shown in FIG. 1(a), in a semiconductor wafer 10, an insulating layer 11 with concave and convex portions that are caused by concave and convex portions formed in a lower layer (not shown) and that are to be planarized has in part a higher platform region 12 with a large area. In the planarizing process conducted by a chemical-mechanical polishing (CMP) process up to a planarization finishing level that is indicated by a broken line L, a part of insulating film 11 in the platform region 12 may remain or dissing may occur in the peripheral region around the platform region 12.

Accordingly, as illustrated in FIG. 1(b), a dummy pattern 13 is formed in the platform region 12 prior to the CMP process. The dummy pattern has specified depth and is such that the insulating layer 11 that is to be subjected to planarization is provided with a plurality of concave and convex portions. The dummy pattern 13 is formed with, for example, a photolithography technique, which is performed so that the patterning is provided to a depth close to the level of the lower region around the platform region 12.

When the CMP process is performed after the pre-process shown in FIG. 1(b) has been conducted, the selectivity of polishing rates created by a polishing pad (not shown) is effectively used by the dummy pattern 13 having a specified depth with the multiple concave and convex portions formed in the entire area of the platform region 12, and slurry spreads entirely through the concave portions. As a result, the CMP process can be uniformly performed until the planarization finishing level L is reached, and improved planarization with reduced dishing and few film thickness errors is achieved.

Figure 2:
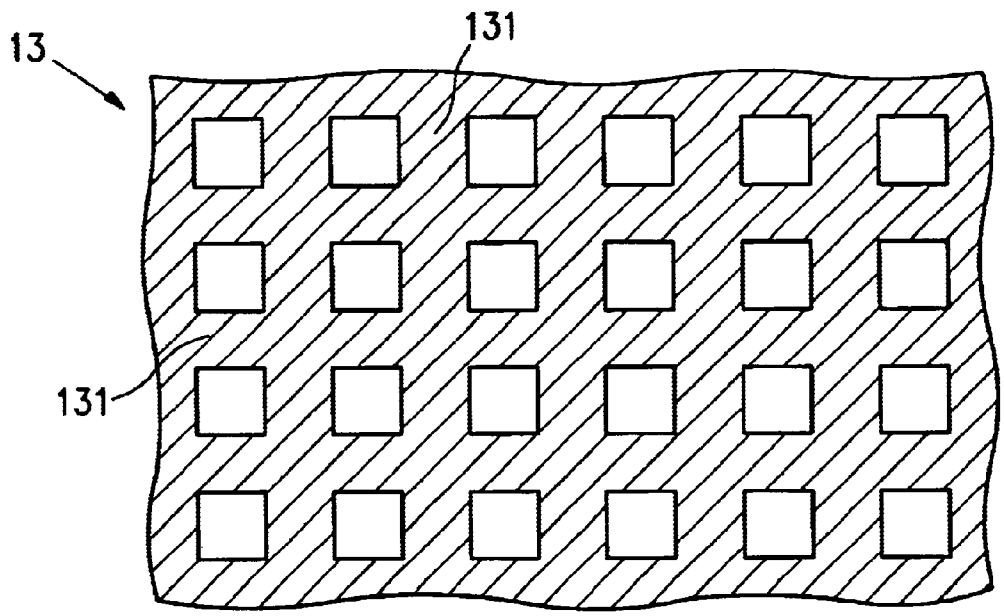
FIG. 2 is a plan view showing a first concrete example of a dummy pattern that is formed in a platform region with a large area, which is formed in a pre-process step prior to the CMP illustrated in FIG. 1 (b).
Figure 3:
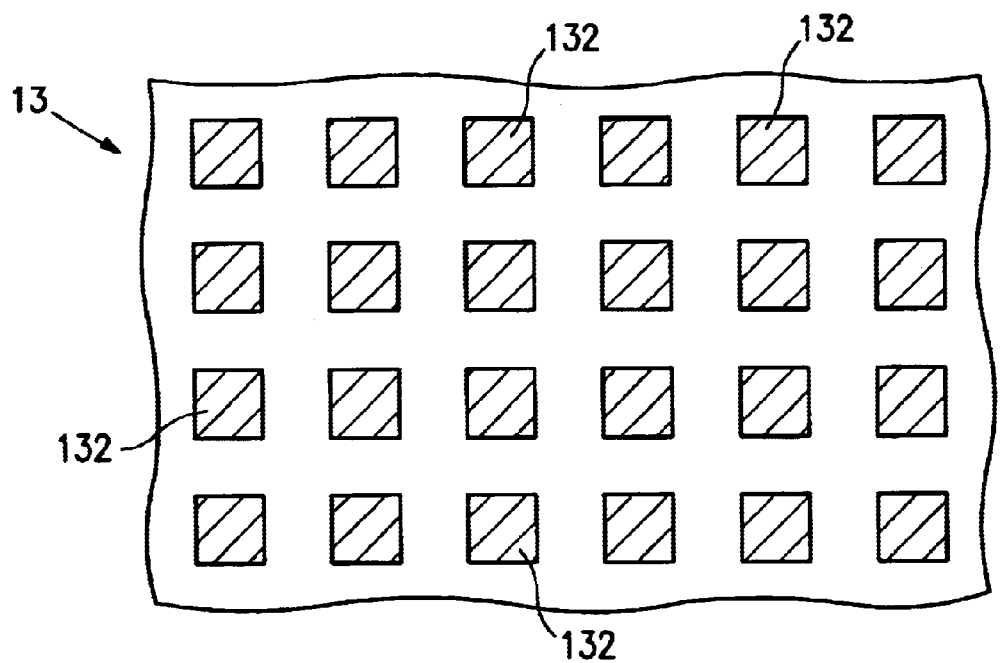
FIG. 3 is a plan view showing a second concrete example of a dummy pattern that is formed in a platform region with a large area, which is formed in a pre-process step prior to the CMP illustrated in FIG. 1 (b).

FIGS. 2 and FIG. 3 provide plan views with examples of dummy patterns 13 that may be formed in the large area platform region 12. Again, these dummy patterns may be formed as a pre-process conducted prior to the CMP illustrated in FIG. 1(b).

Referring to FIG. 2, a lattice pattern of grooves 131 is formed by a photolithography technique. Alternatively, referring to FIG. 3, a pattern of plural openings 132 is formed by a photolithography technique. It should be noted that in these illustrations the areas indicated by hatched lines are concave portions in the patterns 131 and 132. Slurry spreads substantially entirely through these concave portions, and the convex portions around them controllably distribute the pressure of the polishing pad, such that CMP is achieved with more uniformity than would otherwise be the case.

Figure 4:
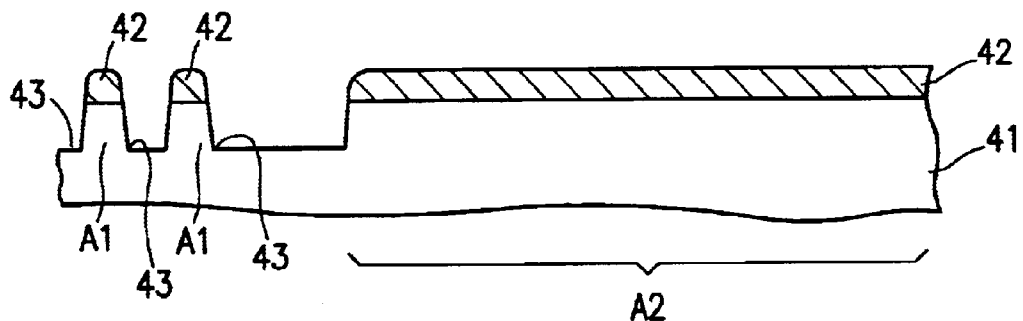
FIG. 4 is a first cross-section illustrating a step of a process in which a trench element isolation region is formed using a method of manufacturing a semiconductor device in accordance with the present invention.

FIGS. 4 through 8 are cross-sectional illustrations of steps (shown in the order that they are performed) of a process in which a trench element isolation region is formed using a method of manufacturing a semiconductor device in accordance with one embodiment the invention. As shown in FIG. 4, a mask pattern composed of a silicon nitride layer or the like 42 is formed on a silicon semiconductor substrate 41, and trenches 43 for element isolation are formed by etching. This example includes a portion where an element region A2 has a larger area compared with a peripheral element region A1.

Figure 5:
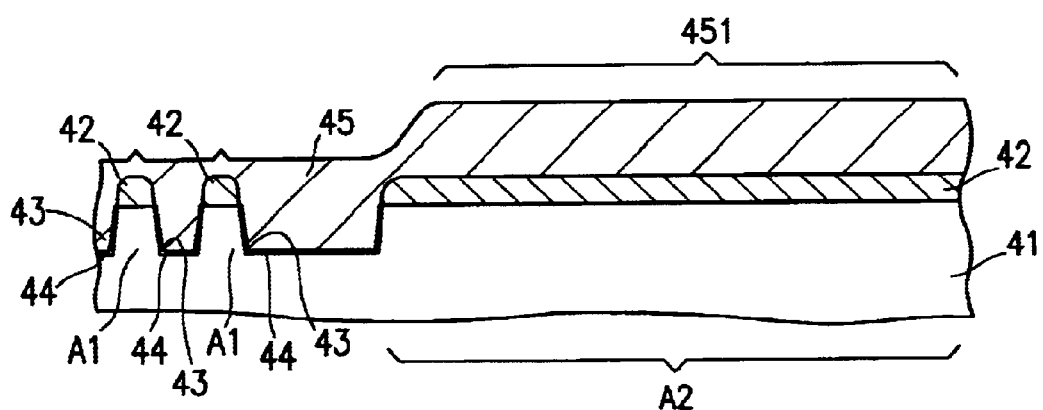
FIG. 5 is a second cross-section illustrating a process step that occurs after the step of FIG. 4.

Next, as shown in FIG. 5, the trenches 43 are oxidized to form oxide films 44, and then an insulating film 45 is formed by a chemical vapor deposition (CVD) method. The insulating films 45 are in different deposit levels according to concave and convex portions of the trenches 43. The insulating film 45 on the large area element region A2 is deposited higher than other regions, and forms a platform (protruded) region 451, which has a large area.

Figure 6:
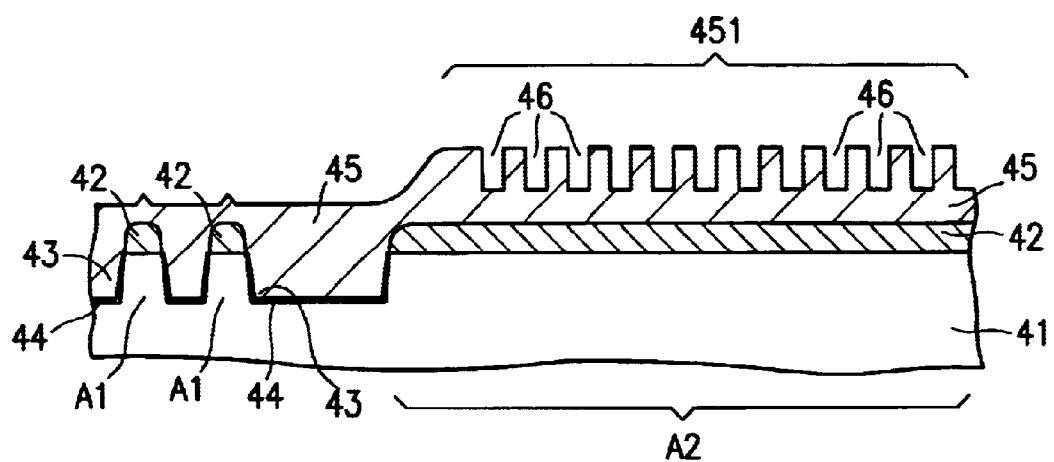
FIG. 6 is a third cross-section illustrating a process step that occurs after the step of FIG. 5.

Next, as shown in FIG. 6, dummy patterns 46 having a predetermined depth are formed against the large area platform region 451 to provide a plurality of concave and convex portions. The dummy patterns 46 may be formed by forming a plurality of openings or lattice pattern of grooves by using, for example, a photolithography technique, in a manner that the patterning is provided up to a depth close to the level of the lower region around the platform region 451. The dummy patterns 46 are formed with, for example, one of the configurations of the examples shown in FIG. 2 or FIG. 3.

Figure 7:
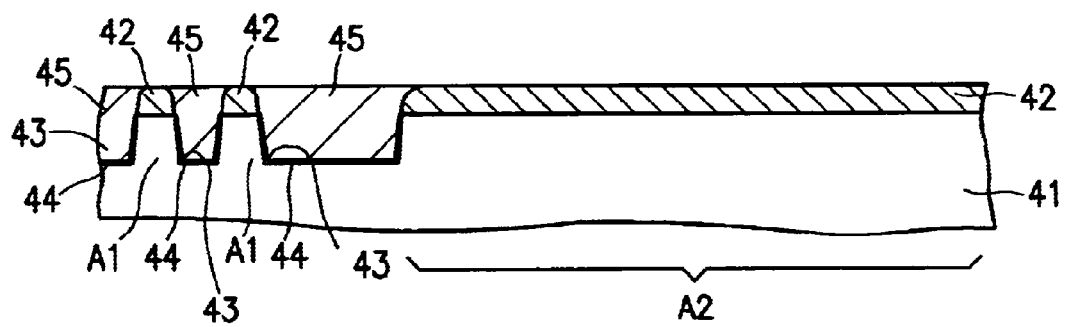
FIG. 7 is a fourth cross-section illustrating a process step that occurs after the step of FIG. 6.
Figure 8:
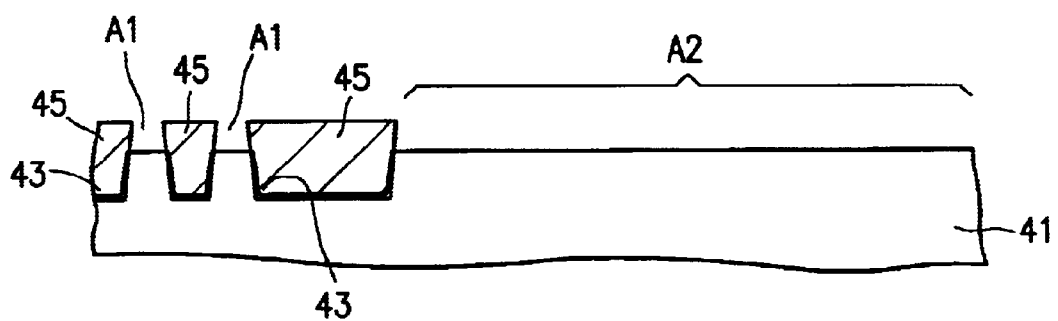
FIG. 8 is a fifth cross-section illustrating a process step that occurs after the step of FIG. 7.
Figure 9A:
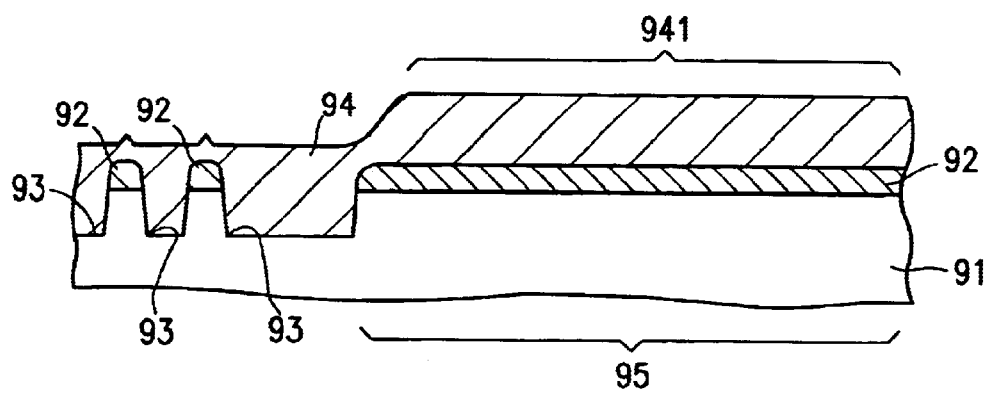
Figure 10:
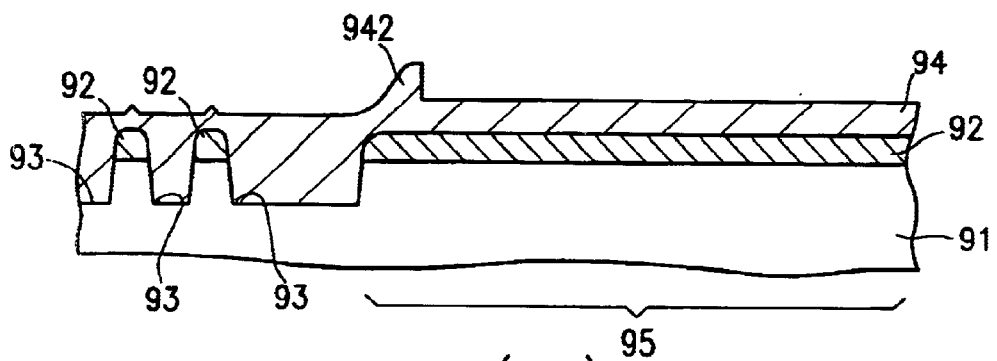
FIG. 10 is a cross-section obtained at the time of detection of a nitride film as a stopper film in a CMP process after planarization is conducted on the structure shown of FIG. 9(b) using a CMP method.
Figure 10:
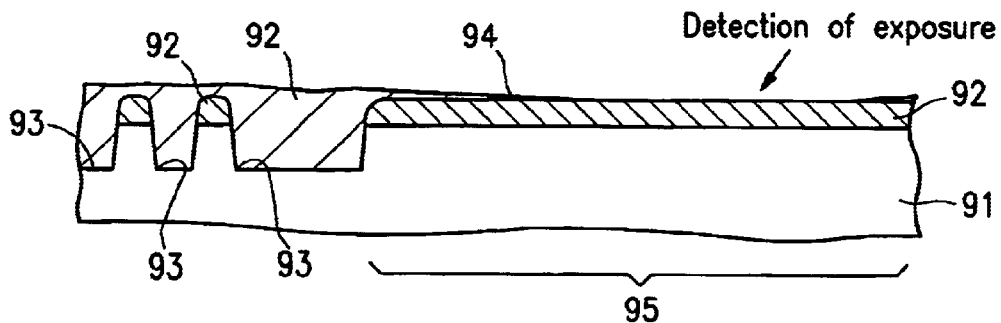

Next, the CMP process is performed as shown in FIG. 7. Selectivity of polishing rates created by a polishing pad (not shown) is effectively used by the dummy patterns 46 having a specified depth with the multiple concave and convex portions formed in the entire area of the platform region 451, and slurry spreads entirely through the concave portions. As a result, the CMP process can be uniformly performed until the exposure of the nitride film 42 that serves as a stopper film for the CMP process is detected, and planarization with reduced dishing and few film thickness errors is achieved. Then, as shown in FIG. 8, the nitride film 42 is removed, and a trench element isolation insulating film in which oxide films 45 are embedded in the trenches 43 is formed.

Next, elements are formed in the peripheral element region A1 and the element region A2. Each of the elements may be a MIS transistor including a gate electrode. In this case, the gate electrode formed in the element region A2 is wider than the gate electrode formed in the peripheral element region A1.

In the structure and process described above, almost none of the insulating film 45 remains on the nitride film 42 after the CMP process is completed upon detection of the exposure of the nitride film 42. Moreover, the removal of the remaining insulating film 45 is substantially controlled compared to the conventional method. Accordingly, the process can proceed to the step of removing the nitride film 42 under a more appropriate condition, while the reduction of the CMP process efficiency and deterioration of the polishing pad are minimized. Therefore, influence that may be caused by variations in the thickness of the insulating film 45 as a trench element isolation film is substantially reduced, such that a high reliability can be maintained in the succeeding steps in manufacturing devices.

It is noted that the pre-planarization processing method in accordance with the present invention is not limited to the embodiments described above, and is also effective for any platform region that is uniformly higher than a planarization finishing level of a layer that is to be subject to a planarization process where dishing problems are expected. In other words, by forming a dummy pattern having a predetermined depth with a plurality of concave and convex portions in the problematic region in a stage prior to the CMP process, dishing can be reduced using the CMP process, and a planarization level with a higher precision can be achieved.

What is claimed is:

1. A method of manufacturing a semiconductor device comprising:
   forming a trench in a substrate which has a first region and a second region larger than the first region, wherein the trench is provided between the first region and the second region for isolating the first region and the second region;
   forming an insulating film on the substrate and in the trench;
   forming a dummy pattern which includes a plurality of concave and convex portions in the insulating film on the second region; and
   planarizing the insulating film by a chemical-mechanical polishing.

2. The method of claim 1, wherein the dummy pattern is provided by forming a lattice pattern of grooves.

3. The method of claim 2, wherein the dummy pattern is created by photolithography.

4. The method of claim 1, wherein the dummy pattern is provided by forming a pattern of multiple openings.

5. The method of claim 4, wherein the dummy pattern is created by photolithography.

6. The method of claim 1, further comprising:
   forming a first element in the first region and a second element larger than the first element in the second region.

7. The method of claim 1, wherein planarizing the insulating film by a chemical-mechanical polishing, comprises:
   then planarizing the insulating film by a chemical-mechanical polishing, immediately after forming the dummy pattern.

8. The method of claim 1, wherein the second region comprises a platform region having a height greater than the first region.

9. A method for semiconductor device manufacturing, the method comprising:
   forming a platform region;
   forming a dummy pattern in the platform region, the dummy pattern having a plurality of regions of differing heights; and
   then conducting chemical-mechanical polishing of the platform region.

10. The method of claim 9, wherein forming the dummy pattern comprises forming a lattice pattern of grooves in the platform region.

11. The method of claim 10, wherein the lattice pattern of grooves in the platform region is formed using photolithography.

12. The method of claim 9, wherein forming the dummy pattern comprises forming a pattern of multiple openings in the platform region.

13. The method of claim 12, wherein the pattern of multiple openings is formed in the platform region using photolithography.

14. The method of claim 9, further comprising:
   forming a trench element isolation region.

15. The method of claim 14, further comprising:
   oxidizing a trench in the trench element isolation region to form an oxide film.

16. The method of claim 15, further comprising:
   forming an oxide film using a chemical vapor deposition method.

17. The method of claim 16, wherein the platform region is formed by forming the oxide film using the chemical vapor deposition method.

18. The method of claim 9, wherein forming a dummy pattern in the platform region, the dummy pattern having a plurality of regions of differing heights, comprises:
   then forming a dummy pattern in the platform region, immediately after forming the platform region, the dummy pattern having a plurality of regions of differing heights.

19. A manufacturing method, comprising:
   providing a substrate;
   forming a mask pattern over the substrate;
   etching the substrate through the mask pattern;
   forming a film over the substrate, wherein the film includes a platform region having a height greater than the height of another region of the film;
   forming a dummy pattern in the platform region of the film,
   wherein the dummy pattern includes regions having differing heights; and
   then performing a chemical-mechanical polishing process on the film in the region of the dummy pattern.

20. The manufacturing method of claim 19, wherein forming the mask pattern over the substrate includes depositing a nitride layer over the substrate.

21. The manufacturing method of claim 19, wherein etching the substrate through the mask pattern includes etching the substrate to form a trench in the substrate.

22. The manufacturing method of claim 21, further comprising:

forming an oxide film over the trench.

23. The manufacturing method of claim 19, wherein forming the film over the substrate includes forming an oxide film over the substrate, and wherein the platform region is formed in the oxide film.

24. The manufacturing method of claim 19, wherein performing chemical mechanical polishing on the film includes removing the film to expose at least a part of the mask pattern.

25. The manufacturing method of claim 24, further comprising:

removing at least a part of the exposed part of the mask pattern.

26. The manufacturing method of claim 19, wherein forming the dummy pattern in the platform region of the film includes forming a lattice pattern of grooves in the platform region.

27. The manufacturing method of claim 19, wherein forming the dummy pattern in the platform region of the film includes forming a pattern of multiple openings arrayed in a grid pattern in the film.

28. The method of claim 19, wherein forming a dummy pattern in the platform region of the film, comprises:

forming a dummy pattern in the platform region of the film via photolithography.

29. The method of claim 19, wherein forming a dummy pattern in the platform region of the film, comprises:

then forming a dummy pattern in the platform region of the film, immediately after forming the film over the substrate.

* * * * *